(12) United States Patent
Kandala et al.

(10) Patent No.: US 11,127,718 B2
(45) Date of Patent: Sep. 21, 2021

(54) MULTI-CHIP STACKED DEVICES

(71) Applicant: XILINX, INC., San Jose, CA (US)

(72) Inventors: Anil Kumar Kandala, Hyderabad (IN); Vijay Kumar Koganti, Hyderabad (IN); Santosh Yachareni, Hyderabad (IN)

(73) Assignee: XILINX, INC., San Jose, CA (US)

( * ) Notice: Subject to any disclaimer, the term of this patent is extended or adjusted under 35 U.S.C. 154(b) by 81 days.

(21) Appl. No.: 16/741,319

(22) Filed: Jan. 13, 2020

(65) Prior Publication Data

US 2021/0217729 A1    Jul. 15, 2021

(51) Int. Cl.

| | |
|---|---|
| *H01L 21/00* | (2006.01) |
| *H01L 25/065* | (2006.01) |
| *H01L 23/48* | (2006.01) |
| *H01L 23/528* | (2006.01) |
| *H01L 23/00* | (2006.01) |
| *H01L 25/00* | (2006.01) |

(52) U.S. Cl.
CPC ........ *H01L 25/0657* (2013.01); *H01L 23/481* (2013.01); *H01L 23/528* (2013.01); *H01L 24/08* (2013.01); *H01L 24/89* (2013.01); *H01L 24/94* (2013.01); *H01L 25/50* (2013.01); *H01L 2224/08146* (2013.01); *H01L 2224/08147* (2013.01); *H01L 2224/80001* (2013.01); *H01L 2225/06541* (2013.01); *H01L 2225/06565* (2013.01); *H01L 2924/1431* (2013.01)

(58) Field of Classification Search
CPC .. H01L 25/0657; H01L 23/481; H01L 23/528
See application file for complete search history.

(56) References Cited

U.S. PATENT DOCUMENTS

| | | | |
|---|---|---|---|
| 7,642,173 B2 * | 1/2010 | McDonald | .............. H01L 25/50 438/455 |
| 8,362,800 B2 | 1/2013 | Or-Bach et al. | |
| 9,213,358 B2 | 12/2015 | Kamal et al. | |
| 9,219,479 B2 | 12/2015 | Tseng et al. | |
| 9,461,000 B2 | 10/2016 | DeLaCruz | |
| 9,509,307 B1 * | 11/2016 | Santurkar | ............ H03K 19/003 |
| 9,564,420 B2 * | 2/2017 | Yu | ............................ H01L 24/20 |
| 9,793,243 B2 * | 10/2017 | Lu | ......................... H01L 23/528 |
| 10,163,878 B2 * | 12/2018 | Kao | .................... H01L 23/5226 |
| 10,217,649 B2 * | 2/2019 | Lai | ......................... H01L 24/16 |

(Continued)

*Primary Examiner* — Laura M Menz

(74) *Attorney, Agent, or Firm* — Patterson + Sheridan, LLP

(57) ABSTRACT

Examples described herein generally relate to multi-chip devices having stacked chips. In an example, a multi-chip device includes a chip stack that includes chips. One or more chips each includes a selection circuit and a broken via pillar that includes first and second continuous portions. The first continuous portion includes a through substrate via and a first metal line. The second continuous portion includes a second metal line. The first and second metal lines are disposed within dielectric layers disposed on a side of the semiconductor substrate of the respective chip. The first and second continuous portions are aligned in a direction normal to the side of the semiconductor substrate. An input node of the selection circuit is connected to one of the first or second metal line. An output node of the selection circuit is connected to the other of the first or second metal line.

12 Claims, 4 Drawing Sheets

(56) References Cited

U.S. PATENT DOCUMENTS

| | | | |
|---|---|---|---|
| 10,269,682 B2* | 4/2019 | Hsieh | H01L 24/83 |
| 10,466,275 B1* | 11/2019 | Vundavalli | G01R 31/3004 |
| 10,886,921 B1* | 1/2021 | Koganti | H01L 25/0657 |
| 10,892,011 B2* | 1/2021 | Lin | H01L 23/49816 |
| 11,004,833 B1* | 5/2021 | Kandala | H01L 25/0657 |
| 11,043,470 B2* | 6/2021 | Jing | H01L 23/5283 |
| 2003/0067804 A1* | 4/2003 | Guaitini | G11C 16/08 365/185.18 |
| 2009/0045487 A1* | 2/2009 | Jung | H01L 23/525 257/621 |
| 2013/0037802 A1* | 2/2013 | England | H01L 25/18 257/48 |
| 2015/0130078 A1* | 5/2015 | Hong | H01L 23/3128 257/774 |
| 2016/0049377 A1* | 2/2016 | Kim | H01L 24/13 257/621 |
| 2016/0071783 A1 | 3/2016 | Barowski et al. | |
| 2017/0053898 A1* | 2/2017 | Yeh | H01L 24/81 |
| 2019/0238134 A1* | 8/2019 | Lee | H03K 19/1776 |
| 2019/0245543 A1* | 8/2019 | Lee | G11C 11/412 |
| 2019/0268086 A1 | 8/2019 | Wuu et al. | |
| 2019/0326273 A1* | 10/2019 | Bhagavat | H01L 23/49827 |
| 2020/0185039 A1* | 6/2020 | Chibvongodze | G11C 11/5642 |
| 2020/0312766 A1* | 10/2020 | Bhagavat | H01L 23/5283 |
| 2021/0134760 A1* | 5/2021 | Gaide | H01L 21/78 |
| 2021/0183412 A1* | 6/2021 | Pulipati | H03K 19/09429 |
| 2021/0217729 A1* | 7/2021 | Kandala | H01L 25/0657 |

* cited by examiner

MULTI-CHIP STACKED DEVICES

TECHNICAL FIELD

Examples of the present disclosure generally relate to multi-chip devices containing stacked chips.

BACKGROUND

Apparatuses, including modules and/or packages, that include multiple integrated circuit chips have been developed. The forms of such apparatuses are varied. By forming such apparatuses, an electronic device can integrate multiple chips to form the device, where each chip can be manufactured using standard semiconductor processing to then be assembled and packaged to form a larger, multi-functional device. By having different chips, in some instances, semiconductor processing that is difficult to integrate can be separated, such as when parts of one chip require a different process from another chip.

Another aspect is an ability to build a device having chips with different functionalities (for example, some are field programmable gate array (FPGA) chips and some are memory chips) into a same apparatus with a smaller device size, more functionality, and lower power. Semiconductor processes for a chip can be more focused to give devices a greater edge in areas such as increased performance of the chip, reduced costs, and increased yield in manufacturing. Other benefits can be realized by such apparatuses.

SUMMARY

Examples described herein generally relate to multi-chip devices having vertically stacked chips. More specifically, some examples described herein relate to structures and circuits within chips of a chip stack for inputting and outputting signals between the chips. Some examples can reduce the number of through substrate vias (TSVs) in a chip, can reduce bottlenecking of routing in metal layers in the chip, can enable flexibility of communications of signals, and can enable different chips in a chip stack to have a same integrated circuit and hardware, among others.

An example described herein is a multi-chip device. The multi-chip device includes a chip stack. The chip stack includes a plurality of chips. Neighboring pairs of chips in the chip stack are attached to each other. One or more of the chips each includes a first broken via pillar and a first selection circuit. The first broken via pillar includes a first continuous portion and a second continuous portion. The first continuous portion includes a first TSV and a first metal line. The first TSV is through a semiconductor substrate of the respective chip. The first metal line is disposed within a group of dielectric layers disposed on a side of the semiconductor substrate of the respective chip. The second continuous portion includes a second metal line. The second metal line is disposed within the group of dielectric layers. The first continuous portion and the second continuous portion are aligned in a direction normal to the side of the semiconductor substrate. The first continuous portion is not connected to the second continuous portion. A first input node of the first selection circuit is connected to one of the first metal line or the second metal line. An output node of the first selection circuit is connected to the other of the first metal line or the second metal line.

Another example described herein is a method of operating a multi-chip device. A first signal is received at a first selection circuit from a first continuous portion of a first broken via pillar. The first broken via pillar is in a first chip of a plurality of chips of a chip stack. Neighboring pairs of chips in the chip stack are attached to each other. A second signal is transmitted from the first selection circuit through a second continuous portion of the first broken via pillar. One of the first continuous portion and the second continuous portion includes a first TSV through a semiconductor substrate of the first chip. The first continuous portion and the second continuous portion are aligned in a direction normal to a side of the semiconductor substrate. The first continuous portion is not connected to the second continuous portion.

Another example described herein is a multi-chip device. The multi-chip device includes a first chip and a second chip attached to the first chip. The first chip includes a first selection circuit, a first broken via pillar, a second selection circuit, and a second broken via pillar. The first broken via pillar extends through a first semiconductor substrate of the first chip and a first group of dielectric layers on a first side of the first semiconductor substrate. The first broken via pillar includes a first continuous portion and a second continuous portion. The first continuous portion includes a first TSV through the first semiconductor substrate. An output node of the first selection circuit is connected to the first continuous portion. The second continuous portion is aligned with the first continuous portion in a direction normal to the first side of the first semiconductor substrate. The second continuous portion is connected to a first input node of the first selection circuit. The second broken via pillar extends through the first semiconductor substrate and the first group of dielectric layers. The second broken via pillar includes a third continuous portion and a fourth continuous portion. The third continuous portion includes a second TSV through the first semiconductor substrate. The third continuous portion is connected to a first input node of the second selection circuit. The fourth continuous portion is aligned with the third continuous portion in a direction normal to the first side of the first semiconductor substrate. An output node of the second selection circuit is connected to the fourth continuous portion.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
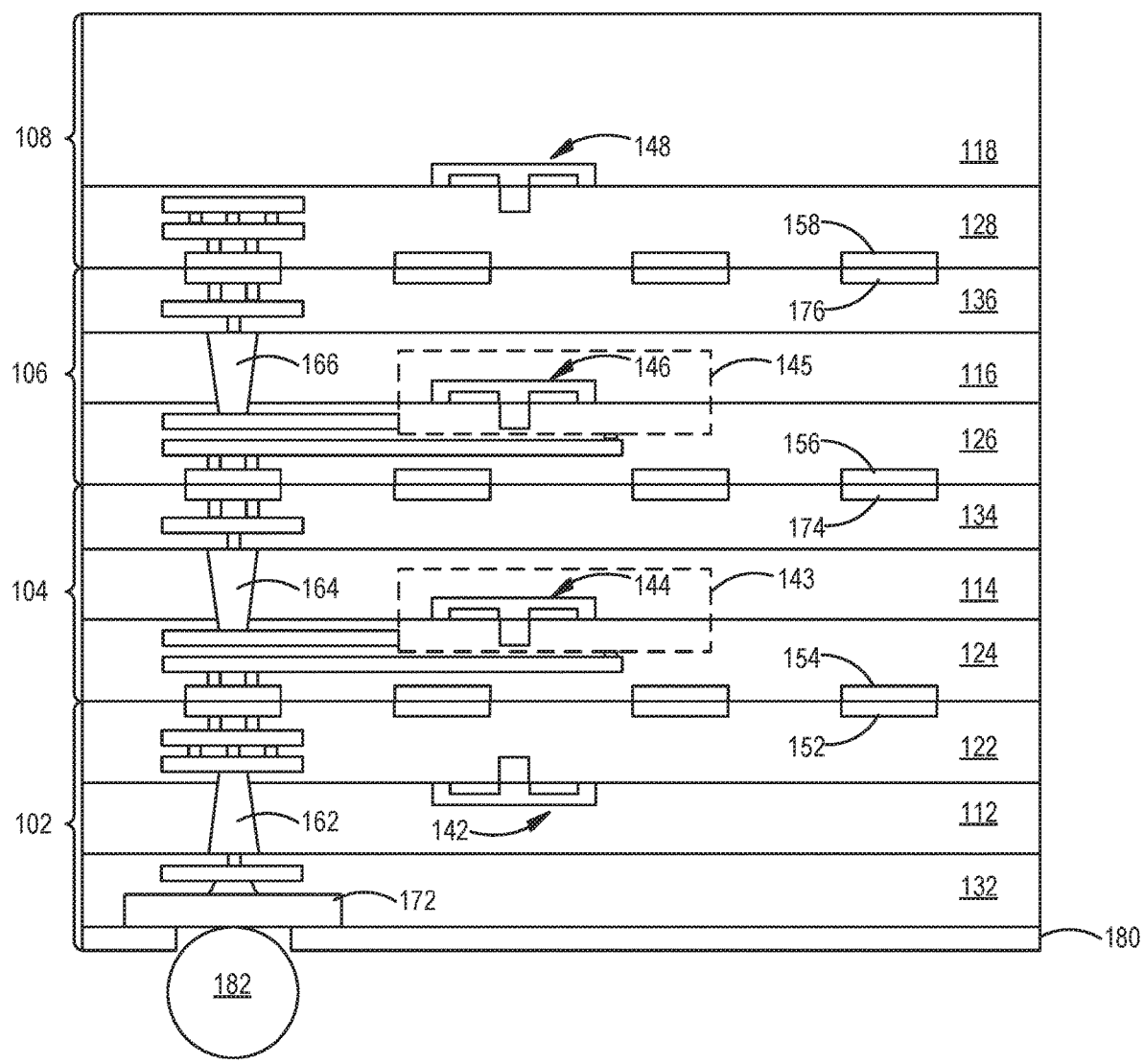
FIG. 1 is a structure of a multi-chip device having a chip stack according to some examples.

Examples described herein generally relate to multi-chip devices having vertically stacked chips. More specifically, some examples described herein relate to structures and circuits within chips of a chip stack for inputting and outputting signals between chips. One or more of the chips in the chip stack can include one or more broken via pillars and respective selection circuits. A broken via pillar can include a first continuous portion and a second continuous portion that are aligned in a direction normal to a side of the semiconductor substrate of the chip. The first continuous portion, as an example, can include metal line(s) and/or via(s) in backside dielectric layer(s) on a backside of the semiconductor substrate, a through substrate via (TSV) through the semiconductor substrate, and metal line(s) and/or via(s) in front side dielectric layer(s) on a front side of the semiconductor substrate. The second continuous portion, as an example, can include metal line(s) and/or via(s) in the front side dielectric layer(s) on the front side of the semiconductor substrate. The first continuous portion is not connected to the second continuous portion.

A selection circuit is connected between the first continuous portion and the second continuous portion. One of the first continuous portion and the second continuous portion is connected to a first input node of the selection circuit and may further be connected to an input node of some other circuit of the chip. A second input node of the selection circuit may be connected to an output node of the other circuit of the chip. The other of the first continuous portion and the second continuous portion is connected to an output node of the selection circuit.

A broken via pillar and selection circuit can enable a signal to be received from, e.g., an overlying or underlying chip in the chip stack and a signal to be output to, e.g., an underlying or overlying chip, respectively, in the chip stack by the same broken via pillar. In some cases, a signal received from, e.g., an overlying or underlying chip can be passed through the broken via pillar and output to, e.g., an underlying or overlying chip, respectively. Such a structure and selection circuit can reduce the number of TSVs in a chip, e.g., by half. Previously, a via pillar including a TSV was dedicated to an input or output signal. Some examples described herein permit an input signal and an output signal to share a broken via pillar (e.g., within a same area of the chip), which can reduce the total number of TSVs for input and output signals by half. This can reduce bottlenecking of routing in metal layers in the chip. Additionally, broken via pillars can enable flexibility of communications of signals and can enable different chips in a chip stack to have a same integrated circuit (IC) and hardware, which can reduce the number of variants of chips to be designed and taped out. Even further, control of configurability of a broken via pillar in some examples can be simplified compared to, e.g., tri-state buffer solutions. Aspects of these and other examples are described below. Additional or other benefits may be achieved by various examples, as a person having ordinary skill in the art will readily understand upon reading this disclosure.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

FIG. 1 is a structure of a multi-chip device according to some examples. The multi-chip device of FIG. 1 includes a chip stack that includes a base chip 102 and fabric chips 104, 106, 108. The base chip 102 and fabric chips 104-108 are described herein as examples. Although the different chips are described herein as being or including various ICs or components (e.g., fabric, base, programmable logic, etc.), aspects described herein can be generally applicable to chips of a multi-chip device having any type of IC or component.

In the multi-chip device of FIG. 1, the fabric chips 104-108 are arranged active or front side facing down towards the base chip 102, where the base chip 102 is arranged active or front side facing up towards the fabric chips 104-108. In other multi-chip devices, intermediate fabric chips are arranged active or front side facing up away from the base chip 102, and a distal fabric chip is arranged active or front side facing down towards the base chip 102, where the base chip 102 is arranged active or front side facing up towards the fabric chips 104-108. Various other multi-chip devices can have different structures, different number of chips, additional components, etc.

Generally, the chips 102-108 are stacked and form a chip stack in the multi-chip device. The chips 102-108 are stacked to form, in some examples, an Active die-on-Active die (AoA) device. In some examples, more or fewer chips can be included in the chip stack. For example, a multi-chip device can have two chips, such as a base chip and a fabric chip, or two fabric chips. In other examples, a multi-chip device can have three chips, four chips, five chips, etc.

Each of the chips 102-108 includes a respective semiconductor substrate 112, 114, 116, 118 and respective front side dielectric layer(s) 122, 124, 126, 128 on a front side of the respective semiconductor substrate 112-118. The front side dielectric layer(s) 122-128 include metallization (e.g., metal lines and/or vias) (illustrated but not specifically numbered) formed therein which can electrically connect various components in an IC. Each of the chips 102-106 includes respective backside dielectric layer(s) 132, 134, 136 on a backside of the respective semiconductor substrate 112-116. The backside dielectric layer(s) 132-136 include metallization (e.g., metal lines and/or vias) (illustrated but not specifically numbered) formed therein which can electrically connect various components in an IC. As illustrated, metallization in front side dielectric layer(s) 124, 126 of the fabric chips 104, 106 connect to respective circuit regions 143, 145 of the fabric chips 104, 106, which will be described in further detail below in the context of subsequent figures.

Each semiconductor substrate 112-118 of the chips 102-108 includes, e.g., a transistor 142, 144, 146, 148 formed on and/or in the front side surface of the respective semiconductor substrate 112-118. The transistor 142-148 and any other components can be connected to the metallization in the front side dielectric layer(s) 122-128. The transistor 144, 146 is illustrated in the respective circuit region 143, 145 of the fabric chip 104, 106; however, the transistor 144, 146 and/or other transistors can be outside of the circuit region 143, 145. Each semiconductor substrate 112-116 of the respective chip 102-106 has backside through-substrate via(s) (TSV(s)) 162, 164, 166 therethrough, which can electrically connect the metallization in the front side dielectric layer(s) 122-126 to the metallization in the backside dielectric layer(s) 132-136 of the respective chip 102-106.

Front side bond pads 152, 154, 156, 158 (e.g., metal (e.g., Cu) bond pads) are formed in the respective front side dielectric layer(s) 122-128 of the chips 102-108 at an exterior surface distal from the respective semiconductor substrate 112-118. The front side bond pads 152-158 can be in an arrangement that forms a respective chip-to-chip interface. The front side bond pads 152-158 are connected to the metallization in the respective front side dielectric layer(s) 122-128. Backside bond pads 174, 176 (e.g., metal (e.g., Cu) bond pads) are formed in the respective backside dielectric layer(s) 134, 136 of the fabric chips 104, 106 at an exterior surface distal from the respective semiconductor substrate 114, 116. The backside bond pads 174, 176 can be in an arrangement that forms a respective chip-to-chip interface. The backside bond pads 174, 176 are connected to the metallization in the respective backside dielectric layer(s) 134, 136.

Exterior connector backside pads 172 (e.g., metal (e.g., aluminum) pads) are formed in the backside dielectric layer(s) 132 of the base chip 102 at an exterior surface distal from the semiconductor substrate 112 of the base chip 102. The exterior connector backside pads 172 are connected to the metallization in the backside dielectric layer(s) 132 of the base chip 102. A passivation layer 180 is formed on the exterior surface distal from the semiconductor substrate 112 of the base chip 102 with respective openings therethrough exposing the exterior connector backside pads 172. External connectors 182 (e.g., controlled collapse chip connections (C4), minibumps, etc.) are formed on respective exterior connector backside pads 172 through the openings in the passivation layer 180.

The external connectors 182 can be attached to a package substrate. The package substrate may further be attached to, e.g., a printed circuit board (PCB) to attach the package substrate (and hence, the multi-chip device) to the PCB. Various other components can be included in a multi-chip device. For example, an interposer, an encapsulant (such as a molding compound (MUF) or the like), etc. can be included in the multi-chip device. A person having ordinary skill in the art will readily envision various modifications that can be made to the multi-chip device.

The chips 102-108 are bonded (e.g., by hybrid bonding using metal-to-metal and oxide-to-oxide bonding) together to form a chip stack. The base chip 102 is bonded to the fabric chip 104 front side to front side such that the front side bond pads 152 and exterior surface of the front side dielectric layer(s) 122 of the base chip 102 are bonded to the front side bond pads 154 and exterior surface of the front side dielectric layer(s) 124 of the fabric chip 104. The fabric chip 104 is bonded to the fabric chip 106 backside to front side such that the backside bond pads 174 and exterior surface of the backside dielectric layer(s) 134 of the fabric chip 104 are bonded to the front side bond pads 156 and exterior surface of the front side dielectric layer(s) 126 of the fabric chip 106. The fabric chip 106 is bonded to the fabric chip 108 backside to front side such that the backside bond pads 176 and exterior surface of the backside dielectric layer(s) 136 of the fabric chip 106 are bonded to the front side bond pads 158 and exterior surface of the front side dielectric layer(s) 128 of the fabric chip 108.

Other arrangements of bonding can be implemented. For example, the base chip 102 can be bonded to the fabric chip 104 front side to backside such that the front side bond pads 152 and exterior surface of the front side dielectric layer(s) 122 of the base chip 102 are bonded to the backside bond pads 174 and exterior surface of the backside dielectric layer(s) 134 of the fabric chip 104. The fabric chip 104 can be bonded to the fabric chip 106 front side to backside such that the front side bond pads 154 and exterior surface of the front side dielectric layer(s) 124 of the fabric chip 104 are bonded to the backside bond pads 176 and exterior surface of the backside dielectric layer(s) 136 of the fabric chip 106. The fabric chip 106 can be bonded to the fabric chip 108 front side to front side such that the front side bond pads 156 and exterior surface of the front side dielectric layer(s) 126 of the fabric chip 106 are bonded to the front side bond pads 158 and exterior surface of the front side dielectric layer(s) 128 of the fabric chip 108.

In other examples, the chips 102-108 can be attached together using external connectors (such as minibumps, solder, etc.). In some examples, some of the chips 102-108 can be attached together by external connectors while others of the chips can be bonded together without use of external connectors. Any permutation of bonding and use of external connectors can be implemented.

Any of the chips in the chip stack can include a Z-interface circuit. A Z-interface circuit can be configurable and can enable communications of signals between chips in the chip stack. The Z-interface circuit can include a selection circuit and a broken via pillar that includes a TSV. The broken via pillar is connected to transmit a signal from the selection circuit to an overlying or underlying chip. The signal from the selection circuit can selectively be (i) a signal transmitted from the broken via pillar and received by the selection circuit or (ii) a signal transmitted from another circuit on the chip and received by the selection circuit. In some examples, the broken via pillar is broken in the sense that the broken via pillar may not be continuously connected through metallizations of a respective front side dielectric layer(s) of the chip, and that continuous portions of the broken via pillar are connected to an intervening selection circuit. Additional details of a Z-interface circuit are described below. Any of the chips 102-108 can include a Z-interface circuit, although, in some examples, the distal fabric chip 108 may omit a TSV and/or metallization in a backside dielectric layer since the distal fabric chip 108 may not undergo backside processing.

In some examples, each of the fabric chips 104-108 can include a processing IC. The processing IC of the fabric chips 104-108 may generally be a same IC. The hardware topology, architecture, and layout of the fabric chips 104-108 may be the same between the fabric chips 104 in some examples, except that the distal fabric chip 108 may omit components formed by backside processing, such as backside TSVs, backside dielectric layer(s), and/or metallization in backside dielectric layer(s). In some examples, the processing IC of the fabric chips 104-108 can include one or more programmable logic regions (e.g., fabric of a FPGA), which may have the same hardware topology, architecture, and layout between the fabric chips 104-108. Having Z-interfaces in the fabric chips 104-108 can permit chips undergoing a same front side processing to be integrated in a multi-chip device while permitting flexibility in how the fabric chips 104-108 are interconnected.

In other examples, the chips 102-108 can each be or include a different IC or can have any permutation of including a same IC and/or different ICs. For example, any of the fabric chips 104-108 can be or include a processing IC or memory. In some examples, the chip 108 is an ASIC. Any chip 102-108 may generically be referred to as an active chip.

Figure 2:
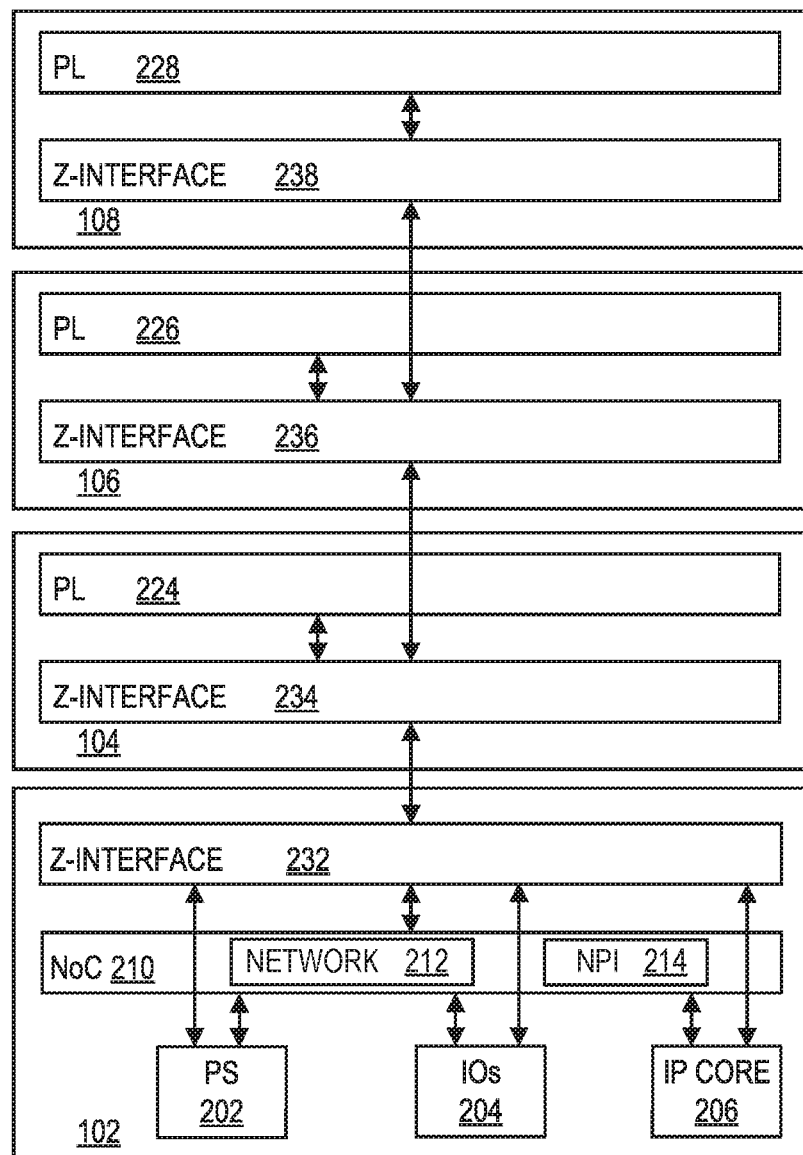
FIG. 2 is a block diagram of a circuit schematic depicting integrated circuits of the chip stack of the multi-chip device of FIG. 1 according to some examples.

FIG. 2 is a block diagram of a circuit schematic depicting ICs of a chip stack of the multi-chip device of FIG. 1 according to some examples. In the illustrated example, the multi-chip device is a multi-chip programmable device. The circuit schematic can be implemented in the multi-chip device of FIG. 1, e.g., regardless of the orientation of the fabric chips 104, 106.

In the illustrated example, the base chip 102 includes a base IC on the base chip 102, which may be a SoC. The fabric chips 104, 106, 108 include a respective programmable logic (PL) IC 224, 226, 228, which, in some examples, may be a same IC and has a same hardware layout and topology. These ICs are provided as an example implementation. Other ICs (e.g., with other hard IP blocks) can be implemented in the chips. The fabric chips 104, 106, 108 further include a respective Z-interface 234, 236, 238.

The base IC on the base chip 102 includes a processing system 202, input/output circuits (IOs) 204, IP core circuits 206, a Network-on-Chip (NoC) 210, and a Z-interface 232. The processing system 202 may be or include any of a variety of different processor types and number of processor cores. For example, the processing system 202 may be implemented as an individual processor, e.g., a single core capable of executing program instruction code. In another example, the processing system 202 may be implemented as a multi-core processor. The processing system 202 may be implemented using any of a variety of different types of architectures. Example architectures that may be used to implement the processing system 202 may include an ARM processor architecture, an x86 processor architecture, a graphics processing unit (GPU) architecture, a mobile processor architecture, a reduced instruction set computer (RISC) architecture (e.g., RISC-V), or other suitable architecture that is capable of executing computer-readable program instruction code.

The input/output circuits 204 can include eXtreme Performance Input/Output (XPIO), multi-gigabit transceivers (MGTs), high bandwidth memory (HBM) interfaces, Analog-to-Digital Converters (ADC), Digital-to-Analog Converters (DAC), or any other input/output blocks. The input/output circuits 204 can be configured to receive and/or transmit signals from and/or to a circuit outside of the multi-chip device. The IP core circuits 206 can include memory controllers (such as double data rate (DDR) memory controllers, high bandwidth memory (HBM) memory controllers, or the like), peripheral component interconnect express (PCIe) interfaces, cache coherent interconnect for accelerators (CCIX) interfaces, Ethernet cores (such as a media address controller (MAC) or the like), forward error correction (FEC) blocks, and/or any other hardened circuit. Any of the input/output circuits 204 and/or IP core circuits 206 can be programmable.

The NoC 210 includes a programmable network 212 and a NoC peripheral interconnect (NPI) 214. The programmable network 212 communicatively couples subsystems and any other circuits of the base IC on the base chip 102 together. The programmable network 212 includes NoC packet switches and interconnect lines connecting the NoC packet switches. Each NoC packet switch performs switching of NoC packets in the programmable network 212. The programmable network 212 has interface circuits at the edges of the programmable network 212. The interface circuits include NoC master units (NMUs) and NoC slave units (NSUs). Each NMU is an ingress circuit that connects a master circuit to the programmable network 212, and each NSU is an egress circuit that connects the programmable network 212 to a slave endpoint circuit. NMUs are communicatively coupled to NSUs via the NoC packet switches and interconnect lines of the programmable network 212. The NoC packet switches are connected to each other and to the NMUs and NSUs through the interconnect lines to implement a plurality of physical channels in the programmable network 212. The NoC packet switches, NMUs, and NSUs include register blocks that determine the operation of the respective NoC packet switch, NMU, or NSU.

The NPI 214 includes circuitry to write to register blocks that determine the functionality of the NMUs, NSUs, and NoC packet switches. The NPI 214 includes a peripheral interconnect coupled to the register blocks for programming thereof to set functionality. The register blocks in the NMUs, NSUs, and NoC packet switches of the programmable network 212 support interrupts, quality of service (QoS), error handling and reporting, transaction control, power management, and address mapping control. The NPI 214 can include an NPI root node residing on the processing system 202 (e.g., a platform management controller (PMC) of the processing system 202), interconnected NPI switches connected to the NPI root node, and protocol blocks connected to the interconnected NPI switches and a corresponding register block. The NPI 214 may be used to program any programmable circuit of the base IC on the base chip 102. For example, the NPI 214 may be used to program any input/output circuit 204 and/or IP core circuit 206 that is programmable.

The Z-interface 232 can include active circuits, such as buffers to drive signals and/or selection circuits. The Z-interface 232 provides an interface, including via metal lines and vias in metallization layers, for the processing system 202, input/output circuits 204, IP core circuits 206, and programmable network 212 of the NoC 210 to chips overlying the base chip 102 and/or a substrate (e.g., package substrate) underlying the base chip 102. Additionally, the Z-interface 232 can provide a pass-through interface through the base chip 102.

The various subsystems and circuits of the base IC on the base chip 102 can be communicatively coupled. As illustrated, the processing system 202, input/output circuits 204, and IP core circuits 206 are connected to the NoC 210 (e.g., to the programmable network 212), and hence, are communicatively coupled to each other. The processing system 202 is further connected to the NPI 214 for communicating configuration data to various programmable components on the base chip 102. The processing system 202 is further connected to the programmable network 212 of the NoC 210 for communicating configuration data to chips overlying the base chip 102. The programmable network 212 of the NoC 210 is connected to the Z-interface 232 such that data, such as transactional data and configuration data, can be communicated through the Z-interface 232 to another chip. Each of the processing system 202, input/output circuits 204, and IP core circuits 206 is connected to the Z-interface 232 for communications with, e.g., programmable logic in the PL ICs 224, 226, 228 in overlying fabric chips 104, 106. Other communication mechanisms, such as direct connections, between the various subsystems and circuits may be implemented.

The PL IC 224-228 on each of the fabric chips 104-108 includes one or more programmable logic region. The programmable logic region is logic circuitry that may be programmed to perform specified functions. The programmable logic region can include any number or arrangement of programmable tiles. As an example, the programmable logic region may be implemented as fabric of an FPGA. For example, the programmable logic region can include any number of configurable logic blocks (CLBs), look-up tables (LUTs), digital signal processing blocks (DSPs), random access memory blocks (BRAMs), etc. Each of the programmable tiles (e.g., CLBs, LUTs, DSPs, BRAMs, etc.) can include one or more programmable interconnect elements. The various respective types of programmable tiles can be arranged in rows and/or columns, and the associate programmable interconnect elements can be connected to neighboring programmable logic elements in a same column and row, for example. The programmable interconnect element can form an interconnect network of the programmable logic region. Any logic and connections can be implemented by the programmable logic region by programming or configuring any of the programmable tiles of the programmable logic region.

The Z-interface 234-238 on each of the fabric chips 104-108 can include active circuits, such as buffers to drive signals and/or selection circuits. The Z-interface 234-238 provides an interface, including via metal lines and vias in metallization layers, for the respective PL IC 224-228 to communicate with chips overlying and/or underlying the respective fabric chip 104-108. Additionally, the Z-interface 234-238 can provide a pass-through interface through the respective fabric chip 104-108. Configuration data for the PL ICs 224-228 can be transmitted through passive connections through Z-interfaces 234-238, for example.

Each PL IC 224-228 can also include a configuration interconnect that includes a configuration Frame (CFRAME) driver. The CFRAME driver may be or include control logic to communicate configuration data (such as a bitstream) to configure programmable logic. Each programmable logic region is configurable or programmable by configuration data received via the Z-interface 232, a corresponding Z-interface 234-238 of the respective fabric chip 104-108, and any intervening Z-interface 234, 236. For example, the processing system 202 (e.g., a PMC of the processing system 202) can transmit configuration data via the programmable network 212 of the NoC 210 and the Z-interface 232 to a respective PL IC 224-228. In some examples, a configuration interconnect (e.g., including a CFRAME driver) can direct the configuration data to appropriate programmable tiles and can control configuring such programmable tiles.

Figure 3:
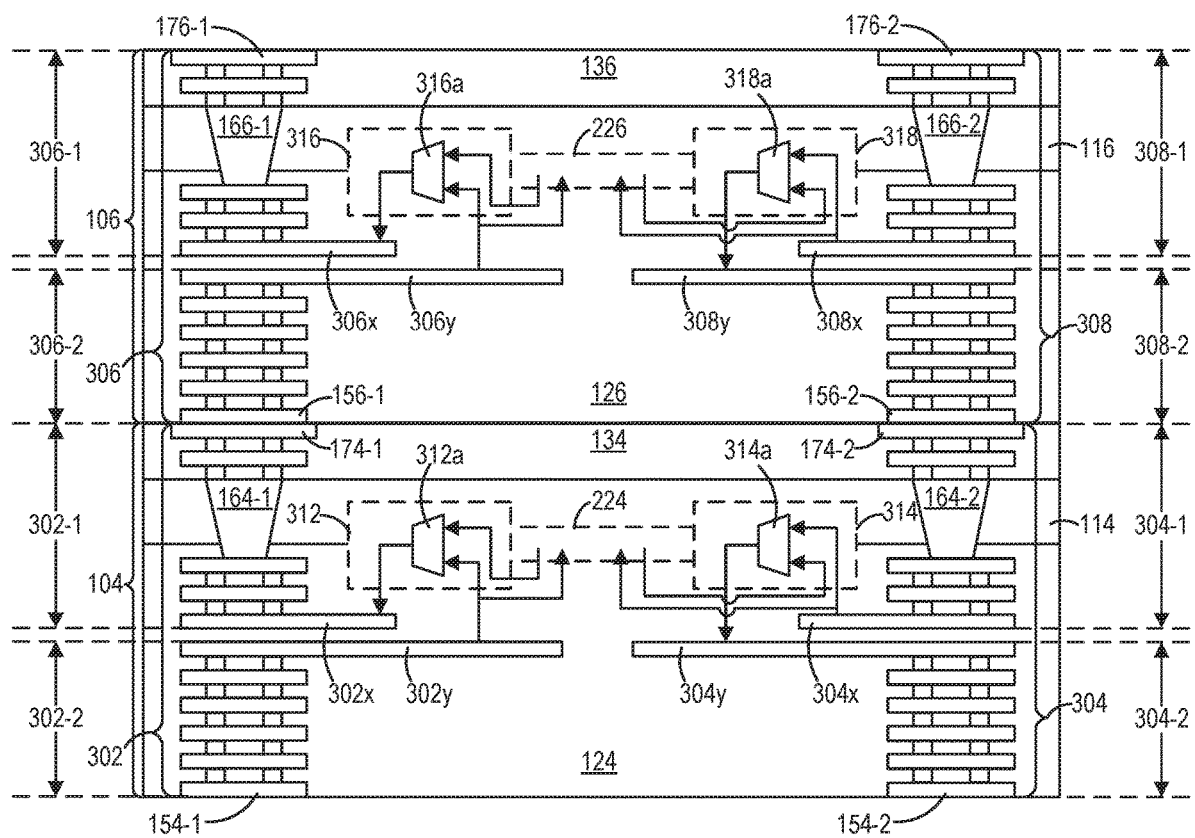
FIG. 3 is a simplified structure of portions of Z-interfaces of some of the chips in the chip stack according to some examples.

FIG. 3 illustrates a simplified structure of at least respective portions of the Z-interfaces 234, 236 of the fabric chips 104, 106 according to some examples. Although described with respect to fabric chips 104, 106, aspects of the described Z-interfaces are applicable to the Z-interface 232 of the base chip 102 and/or the Z-interface 238 of the fabric chip 108 (e.g., without component formed by backside processing). It is noted that FIG. 3 does not illustrate passive pass-through connections that may be present in a Z-interface. FIG. 3 illustrates example broken via pillars and selection circuits that may be present in a Z-interface.

The Z-interface 234 includes a broken via pillar 302, a selection circuit 312, a broken via pillar 304, and a selection circuit 314. The Z-interface 236 includes a broken via pillar 306, a selection circuit 316, a broken via pillar 308, and a selection circuit 318.

Each of the broken via pillars generally includes a first continuous portion and a second continuous portion. The first continuous portion and the second continuous portion are aligned in a direction normal (e.g., vertical) to a side (e.g., a front side or a backside) of the semiconductor substrate of the chip on which the respective broken via pillar is disposed. A first continuous portion generally includes vertically stacked backside bond pad, metal line(s) and/or via(s) in backside dielectric layer(s), TSV, and metal line(s) and/or via(s) in front side dielectric layer(s) that are continuously connected together. A second continuous portion generally includes vertically stacked metal line(s) and/or via(s) in front side dielectric layer(s) and front side bond pad that are continuously connected together.

As illustrated, the broken via pillar 302 in fabric chip 104 includes a first continuous portion 302-1 and a second continuous portion 302-2. The first continuous portion 302-1 includes a backside bond pad 174-1, metal line and vias (illustrated but not specifically identified) in backside dielectric layer(s) 134, a backside TSV 164-1, a metal line $302x$ in front side dielectric layer(s) 124, and metal lines and vias (illustrated but not specifically identified) in front side dielectric layer(s) 124 between the backside TSV 164-1 and the metal line $302x$, which are continuously connected together. The second continuous portion 302-2 includes a metal line $302y$ in front side dielectric layer(s) 124, a front side bond pad 154-1, and metal lines and vias (illustrated but not specifically identified) in front side dielectric layer(s) 124 between the front side bond pad 154-1 and the metal line $302y$.

As illustrated, the broken via pillar 304 in fabric chip 104 includes a first continuous portion 304-1 and a second continuous portion 304-2. The first continuous portion 304-1 includes a backside bond pad 174-2, metal line and vias (illustrated but not specifically identified) in backside dielectric layer(s) 134, a backside TSV 164-2, a metal line $304x$ in front side dielectric layer(s) 124, and metal lines and vias (illustrated but not specifically identified) in front side dielectric layer(s) 124 between the backside TSV 164-2 and the metal line $304x$, which are continuously connected together. The second continuous portion 304-2 includes a metal line $304y$ in front side dielectric layer(s) 124, a front side bond pad 154-2, and metal lines and vias (illustrated but not specifically identified) in front side dielectric layer(s) 124 between the front side bond pad 154-2 and the metal line $304y$.

As illustrated, the broken via pillar 306 in fabric chip 106 includes a first continuous portion 306-1 and a second continuous portion 306-2. The first continuous portion 306-1 includes a backside bond pad 176-1, metal line and vias (illustrated but not specifically identified) in backside dielectric layer(s) 136, a backside TSV 166-1, a metal line $306x$ in front side dielectric layer(s) 126, and metal lines and vias (illustrated but not specifically identified) in front side dielectric layer(s) 126 between the backside TSV 166-1 and the metal line $306x$, which are continuously connected together. The second continuous portion 306-2 includes a metal line $306y$ in front side dielectric layer(s) 126, a front side bond pad 156-1, and metal lines and vias (illustrated but not specifically identified) in front side dielectric layer(s) 126 between the front side bond pad 156-1 and the metal line $306y$.

As illustrated, the broken via pillar 308 in fabric chip 106 includes a first continuous portion 308-1 and a second continuous portion 308-2. The first continuous portion 308-1 includes a backside bond pad 176-2, metal line and vias (illustrated but not specifically identified) in backside dielectric layer(s) 136, a backside TSV 166-2, a metal line 308x in front side dielectric layer(s) 126, and metal lines and vias (illustrated but not specifically identified) in front side dielectric layer(s) 126 between the backside TSV 166-2 and the metal line 308x, which are continuously connected together. The second continuous portion 308-2 includes a metal line 308y in front side dielectric layer(s) 126, a front side bond pad 156-2, and metal lines and vias (illustrated but not specifically identified) in front side dielectric layer(s) 126 between the front side bond pad 156-2 and the metal line 308y.

Generally, a broken via pillar on a chip can be connected to a broken via pillar on another chip. As illustrated, the broken via pillar 302 is connected to the broken via pillar 306 by the backside bond pad 174-1 of the fabric chip 104 being bonded and connected to the front side bond pad 156-1 of the fabric chip 106. Similarly, the broken via pillar 304 is connected to the broken via pillar 308 by the backside bond pad 174-2 of the fabric chip 104 being bonded and connected to the front side bond pad 156-2 of the fabric chip 106. The broken via pillars 302, 304 may similarly be connected (e.g., by front side bond pads 154-1, 154-2) to respective broken via pillars of the base chip 102, and the broken via pillars 306, 308 may be connected (e.g., by backside bond pads 176-1, 176-2) to respective broken via pillars of the fabric chip 108.

Generally, each of the broken via pillars 302, 304, 306, 308 is not continuously connected through metallizations of the respective front side dielectric layer(s) 124, 126 of the fabric chip 104, 106. More specifically, the respective first continuous portion 302-1, 304-1, 306-1, 308-1 of the broken via pillar 302, 304, 306, 308 is not connected to the respective second continuous portion 302-2, 304-2, 306-2, 308-2 of the broken via pillar 302, 304, 306, 308. For example, no via directly connects to and between metal lines 302x, 302y in the broken via pillar 302; no via directly connects to and between metal lines 304x, 304y in the broken via pillar 304; no via directly connects to and between metal lines 306x, 306y in the broken via pillar 306; and no via directly connects to and between metal lines 308x, 308y in the broken via pillar 308.

A selection circuit is connected between the first continuous portion and second continuous portion of a broken via pillar. Each selection circuit 312, 314, 316, 318 can include any logic circuit, and as illustrated, each selection circuit 312, 314, 316, 318 includes a respective multiplexer 312a, 314a, 316a, 318a. As illustrated, the metal line 302y of the second continuous portion 302-2 is connected to an input node of the multiplexer 312a, and an output node of the multiplexer 312a is connected to the metal line 302x of the first continuous portion 302-1. The metal line 304x of the first continuous portion 304-1 is connected to an input node of the multiplexer 314a, and an output node of the multiplexer 314a is connected to the metal line 304y of the second continuous portion 304-2. The metal line 306y of the second continuous portion 306-2 is connected to an input node of the multiplexer 316a, and an output node of the multiplexer 316a is connected to the metal line 306x of the first continuous portion 306-1. The metal line 308x of the first continuous portion 308-1 is connected to an input node of the multiplexer 318a, and an output node of the multiplexer 318a is connected to the metal line 308y of the second continuous portion 308-2. In some examples, the selection circuit can be connected between different portions of the broken via pillar by metal lines of the broken via pillar in respective metal layers that have more than one metal layer disposed therebetween.

A metal line of a first or second continuous portion of the broken via pillar is connected to an input node of another circuit (e.g., the PL IC) of the chip. As illustrated, metal line 302y of the second continuous portion 302-2 is further connected to an input node of the PL IC 224; metal line 304x of the first continuous portion 304-1 is further connected to an input node of the PL IC 224; metal line 306y of the second continuous portion 306-2 is further connected to an input node of the PL IC 226; and metal line 308x of the first continuous portion 308-1 is further connected to an input node of the PL IC 226.

An output node of another circuit (e.g., a PL IC) is connected to an input node of the selection circuit. As illustrated, an output node of the PL IC 224 is connected to an input node of the multiplexer 312a, and another output node of the PL IC 224 is connected to an input node of the multiplexer 314a. An output node of the PL IC 226 is connected to an input node of the multiplexer 316a, and another output node of the PL IC 226 is connected to an input node of the multiplexer 318a.

Although not illustrated, the selection circuit can include configuration memory (e.g., static random access memory (SRAM)) to configure the selection circuit. For example, a logical high or low value can be written to a configuration memory cell (e.g., via a passive Z-interface connection to the processing system 202), and the configuration memory cell can be connected to a control input node of the selection circuit (e.g., multiplexer) to selectively configure the selection circuit based on the logical high or low value written to the configuration memory cell. In some examples, a control input node of the selection circuit can be connected to other circuitry, which may dynamically control the configuration of the selection circuit during operation of the multi-chip device.

In operation, a signal can be received by the fabric chip 104 at the front side bond pad 154-1 and transmitted through the second continuous portion 302-2 of the broken via pillar 302 to the metal line 302y. The signal is then transmitted to both the input node of the multiplexer 312a and the input node of the PL IC 224. The PL IC 224 can process the received signal or another signal, and can output a signal, which may or may not be based on the received signal, to the other input node of the multiplexer 312a. The multiplexer 312a selectively outputs, based on a signal received at a control input node of the multiplexer 312a, the signal received from the metal line 302y or the signal received from the PL IC 224. The signal output by the multiplexer 312a is transmitted to the metal line 302x, and is further transmitted through the first continuous portion 302-1 of the broken via pillar 302 to the backside bond pad 174-1. In some scenarios, a signal received from, e.g., the base chip 102 can be transmitted through the broken via pillar 302 and selection circuit 312 to the fabric chip 106, and can be transmitted through the second continuous portion 302-2 of the broken via pillar 302 to the PL IC 224. In some scenarios, a signal received from, e.g., the base chip 102 can be transmitted through the second continuous portion 302-2 of the broken via pillar 302 to the PL IC 224, processed by the PL IC 224, and a responsive signal based on the received signal can be output by the PL IC 224 and transmitted through the selection circuit 312 and the first continuous portion 302-1 of the broken via pillar 302 to the fabric chip 106. In some scenarios, a signal received from, e.g., the base chip 102 can be transmitted through the second continuous portion 302-2 of the broken via pillar 302 to the PL IC 224, and a signal, which can be independent of the received signal, can be output by the PL IC 224 and transmitted through the selection circuit 312 and the first continuous portion 302-1 of the broken via pillar 302 to the fabric chip 106.

In operation, a signal can be received by the fabric chip 104 at the backside bond pad 174-1 and transmitted through the first continuous portion 304-1 of the broken via pillar 304 to the metal line 304x. The signal is then transmitted to both the input node of the multiplexer 314a and the input node of the PL IC 224. The PL IC 224 can process the received signal or another signal, and can output a signal, which may or may not be based on the received signal, to the other input node of the multiplexer 314a. The multiplexer 314a selectively outputs, based on a signal received at a control input node of the multiplexer 314a, the signal received from the metal line 304x or the signal received from the PL IC 224. The signal output by the multiplexer 314a is transmitted to the metal line 304y, and is further transmitted through the second continuous portion 304-2 of the broken via pillar 304 to the front side bond pad 154-2. In some scenarios, a signal received from, e.g., the fabric chip 106 can be transmitted through the broken via pillar 304 and selection circuit 314 to the base chip 102 and can be transmitted through the first continuous portion 304-1 of the broken via pillar 304 to the PL IC 224. In some scenarios, a signal received from, e.g., the fabric chip 106 can be transmitted through the first continuous portion 304-1 of the broken via pillar 304 to the PL IC 224 and can be processed by the PL IC 224, and a responsive signal based on the received signal can be output by the PL IC 224 and transmitted through the selection circuit 314 and the second continuous portion 304-2 of the broken via pillar 304 to the base chip 102. In some scenarios, a signal received from, e.g., the fabric chip 106 can be transmitted through the first continuous portion 304-1 of the broken via pillar 304 to the PL IC 224, and a signal, which can be independent of the received signal, can be output by the PL IC 224 and transmitted through the selection circuit 314 and the second continuous portion 304-2 of the broken via pillar 304 to the base chip 102.

The broken via pillars 306, 308 and selection circuits 316, 318 can operate similar to the broken via pillars 302, 304 and selection circuits 312, 314, respectively. A person having ordinary skill in the art will readily understand such operation, and hence, description of such operation is omitted here for brevity.

A person having ordinary skill in the art will readily understand that the illustration of FIG. 3 is simplified. In some examples, the front side dielectric layer(s) 122-128 of the respective chips 102-108 each is or includes a group of dielectric layers, such as eighteen or more dielectric layers, e.g., depending on a technology node of the chips 102-108. Further, the front side dielectric layer(s) 122-128 can each have or include eighteen metal layers (e.g., a M0 layer through M17 layer) in some examples, although the number of metal layers can vary, such as depending on technology node of the chips. In some examples with each chip having eighteen metal layers in the front side dielectric layer(s), the metal lines 302x, 304x, 306x, 308x are in a M5 layer, and the metal lines 302y, 304y, 306y, 308y are in a M7 layer. The various metal lines can be in different metal layers in other examples.

A broken via pillar can enable an input to a chip from, e.g., an underlying chip and an output from the chip to, e.g., an overlying chip within a same area (e.g., parallel to the front side or backside) of the chip. For example, the broken via pillar can be used to receive an input signal and to transmit an output signal. This can obviate using two via pillars, each with a TSVs, where one via pillar is for an input signal and another one via pillar is for an output signal. Hence, some examples can implement decreased area usage for Z-direction communications. The decrease area usage can also reduce a bottleneck for routing in metal layers around via pillars on a chip. Additionally, broken via pillars can enable flexibility of communications of signals and can enable different chips in a chip stack to have a same IC and hardware, which can reduce the number of variants of chips to be designed and taped out. Even further, control of configurability of a broken via pillar in some examples can be simplified compared to, e.g., tri-state buffer solutions.

Figure 4:
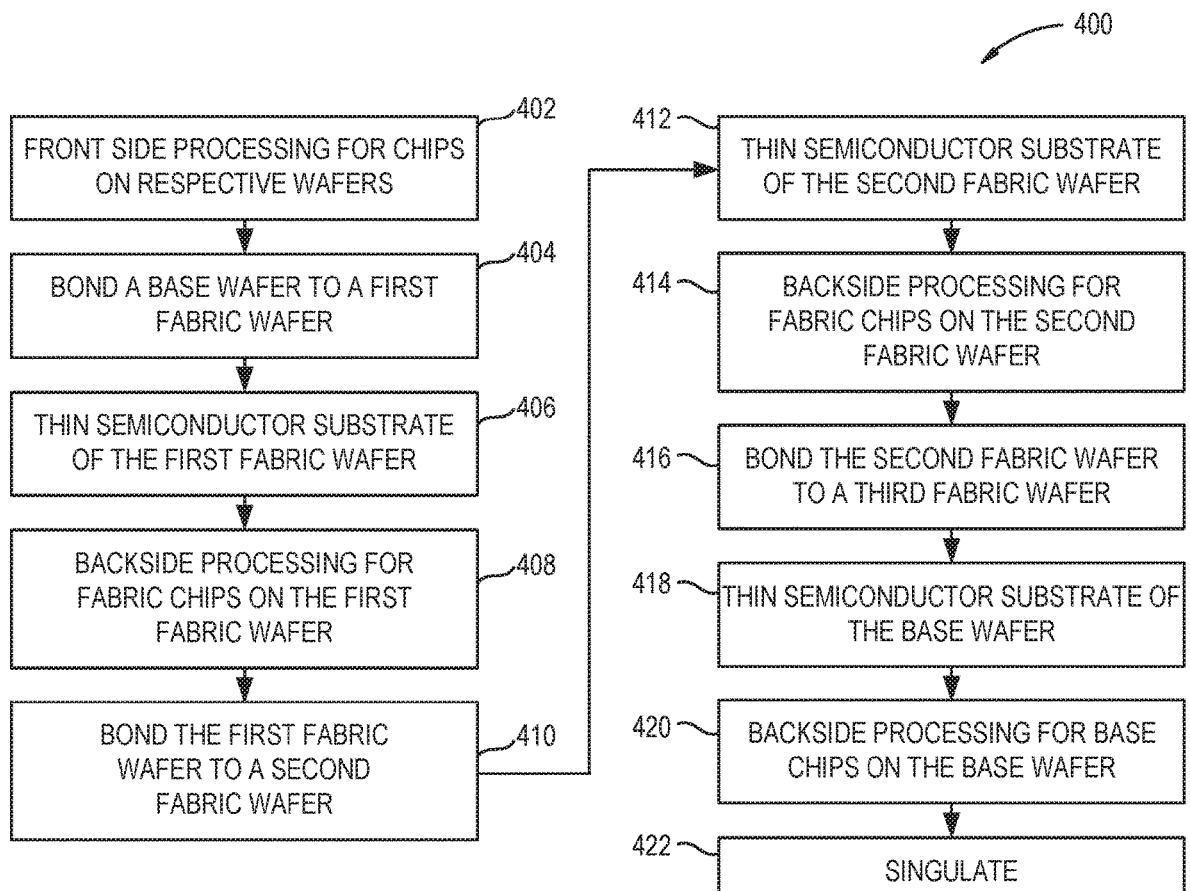
FIG. 4 is a flowchart of a method of forming the multi-chip device of FIG. 1 according to some examples.

FIG. 4 is a flowchart of a method 400 of forming the multi-chip device of FIG. 1 according to some examples. The processing of the method 400 of FIG. 4 is generally described, and a person having ordinary skill in the art will readily understand the more specific processing that can be performed. The more specific processing can be according to any semiconductor processing for forming an IC on substrate, which is to be singulated into a chip. For ease of description herein, a wafer on which one or more base chips 102 are formed is referred to as a base wafer, and a wafer on which one or more fabric chips 104, 106, 108 are formed is referred to as a fabric wafer. Any wafer can be any shape and/or size.

At block 402, front side processing for chips on the respective wafers is performed. For example, front side processing of each semiconductor substrate 112, 114, 116, 118 (e.g., wafer) can include forming devices (e.g., transistors 142, 144, 146, 148) in and/or on the front surface of the semiconductor substrate 112, 114, 116, 118, and forming front side dielectric layer(s) 122, 124, 126, 128 with metallizations and front side bond pads 152, 154, 156, 158 on the front surface of the semiconductor substrate 112, 114, 116, 118. Multiple base chips 102 can be formed on a base wafer. Multiple fabric chips 104, 106, or 108 can be formed on a plurality of fabric wafers. The front side processing can, for example, form the selection circuits and broken via pillars of Z-interfaces that are on and/or in the respective semiconductor substrate and front side dielectric layer(s).

At block 404, a base wafer is bonded to a first fabric wafer, such as front side to front side bonding as shown in FIG. 1. As a result of the bonding, a front side of a base chip 102 is bonded to a front side of a fabric chip 104, as shown in FIG. 1. The bonding can be hybrid bonding, such as bonding front side bond pads 152 on the base wafer to front side bond pads 154 on the first fabric wafer, and bonding the exterior surface of the front side dielectric layer(s) 122 on the base wafer to the exterior surface of the front side dielectric layer(s) 124 on the first fabric wafer.

At block 406, the semiconductor substrate of the first fabric wafer is thinned from a backside of the first fabric wafer. As show in FIG. 1, the semiconductor substrate 114 of the fabric chip 104 is thinned from the backside. The thinning can be by a chemical mechanical polish (CMP) or other appropriate process. At block 408, backside processing for fabric chips on the first fabric wafer is performed. As illustrated by FIG. 1, the backside processing can include forming backside TSVs 164 through the semiconductor substrate 114 of the first fabric wafer and connecting to metallization in the front side dielectric layer(s) 124 on the first fabric wafer. The backside processing can further include forming backside dielectric layer(s) 134 with metallizations and backside bond pads 174 on the backside of the semiconductor substrate 114. The metallizations in the backside dielectric layer(s) 134 can be connected to the metallizations in the front side dielectric layer(s) 124 through the backside TSVs 164. Generally, the formation of backside TSVs and metallizations in the backside dielectric layer(s) can form the broken via pillars of Z-interfaces that are on and/or in the respective semiconductor substrate and backside dielectric layer(s).

At block 410, the first fabric wafer is bonded to a second fabric wafer, such as backside to front side bonding as shown in FIG. 1. As a result of the bonding, a backside of a fabric chip 104 is bonded to a front side of a fabric chip 106, as shown in FIG. 1. The bonding can be hybrid bonding, such as bonding backside bond pads 174 on the first fabric wafer to front side bond pads 156 on the second fabric wafer, and bonding the exterior surface of the backside dielectric layer(s) 134 on the first fabric wafer to the exterior surface of the front side dielectric layer(s) 126 on the second fabric wafer.

At block 412, the semiconductor substrate of the second fabric wafer is thinned from a backside of the second fabric wafer, like described with respect to block 406. As show in FIG. 1, the semiconductor substrate 116 of the fabric chip 106 is thinned from the backside.

At block 414, backside processing for fabric chips on the second fabric wafer is performed, like described with respect to block 408. As illustrated by FIG. 1, the backside processing can include forming backside TSVs 166 through the semiconductor substrate 116 of the second fabric wafer and connecting to metallization in the front side dielectric layer(s) 126 on the second fabric wafer. The backside processing can further include forming backside dielectric layer(s) 136 with metallizations and backside bond pads 176 on the backside of the semiconductor substrate 116. The metallizations in the backside dielectric layer(s) 136 can be connected to the metallizations in the front side dielectric layer(s) 126 through the backside TSVs 166.

At block 416, the second fabric wafer is bonded to a third fabric wafer, such as backside to front side bonding as shown in FIG. 1. As a result of the bonding, a backside of a fabric chip 106 is bonded to a front side of a fabric chip 108, as shown in FIG. 1. The bonding can be hybrid bonding, such as bonding backside bond pads 176 on the second fabric wafer to front side bond pads 158 on the third fabric wafer, and bonding the exterior surface of the backside dielectric layer(s) 136 on the second fabric wafer to the exterior surface of the front side dielectric layer(s) 128 on the third fabric wafer.

At block 418, the semiconductor substrate of the base wafer is thinned from a backside of the base wafer, like described with respect to block 406. As show in FIG. 1, the semiconductor substrate 112 of the base chip 102 is thinned from the backside.

At block 420, backside processing for base chips on the base wafer is performed, like described with respect to block 408. As illustrated by FIG. 1, the backside processing can include forming backside TSVs 162 through the semiconductor substrate 112 of the base wafer and connecting to metallization in the front side dielectric layer(s) 122 on the base wafer. The backside processing can further include forming backside dielectric layer(s) 132 with metallizations and exterior connector backside pads 172 on the backside of the semiconductor substrate 112. The metallizations in the backside dielectric layer(s) 132 can be connected to the metallizations in the front side dielectric layer(s) 122 through the backside TSVs 162. The backside processing for the base chips 102 can further include forming the passivation layer 180 and external connectors 182. At block 422, the bonded wafers are singulated (e.g., by sawing) to separate individual multi-chip devices that have been formed. Each of the multi-chip devices can be as shown in FIG. 1.

The various operations of blocks of the method 400 can be repeated and/or omitted to form various multi-chip devices. The method 400 has been provided as an example of how some multi-chip devices can be formed. In other examples, some operations can be performed in parallel. For example, multiple different wafer stacks can be formed (e.g., by bonding and processing respective wafers) in parallel before the multiple different wafer stacks are then bonded together and further processed to form the multi-chip devices. A person having ordinary skill in the art will readily understand how to form other multi-chip devices based on the description of the method 400 above.

Figure 5:
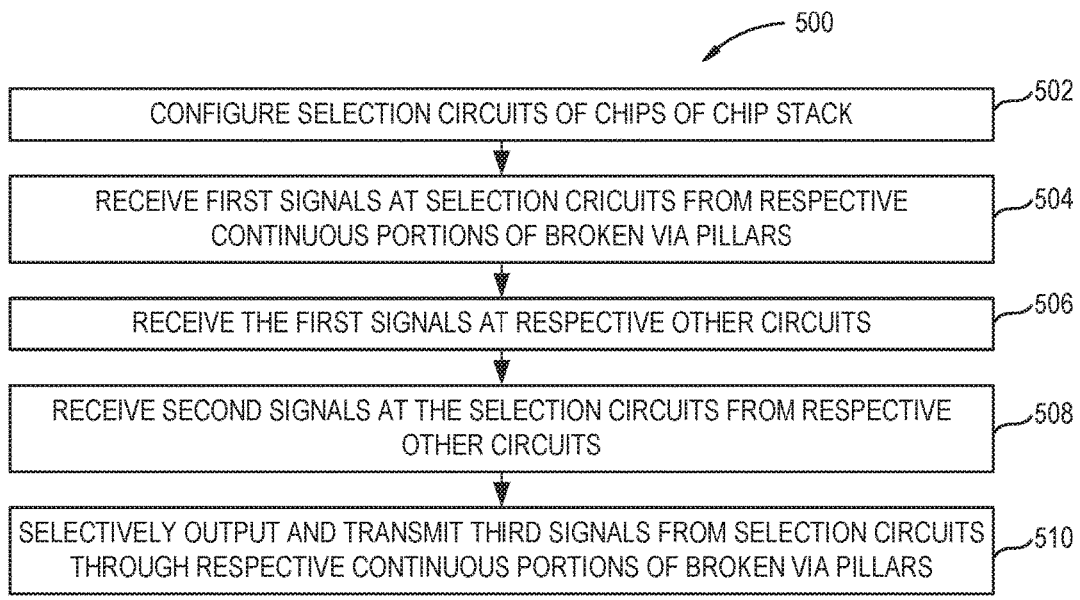
FIG. 5 is a flowchart of a method of operating a multi-chip device according to some examples.

FIG. 5 is a flowchart of a method 500 of operating a multi-chip device according to some examples. The multi-chip device can be as shown in FIGS. 1 through 3, for example. Various operations of the method 500 are described, for illustrative purposes, in the context of the fabric chip 104. A person having ordinary skill in the art will readily understand that such operations can be similarly performed or replicated on other chips, such as the fabric chip 106.

At block 502, selection circuits of the chips are configured to selectively output and transmit a received signal from multiple received signals. For example, the processing system 202 of the base chip 102 can transmit configuration data through passive connections of Z-interfaces 232-238 to respective fabric chips 104-108, where the selection circuits of the Z-interfaces 234-238 are configured, such as by writing configuration data to configuration memory of the selection circuit. Any selection circuits of the base chip 102 can be configured directly by the processing system 202 without communicating the corresponding configuration data through a Z-interface. As further detail of the example, the selection circuits 312, 314 of the fabric chip 104 can be configured, such as by writing configuration data to configuration memory. The selection circuit 312 can be configured to selectively output a signal received from the metal line 302$y$ or a signal received from the PL IC 224. The selection circuit 314 can be configured to selectively output a signal received from the metal line 304$x$ or a signal received from the PL IC 224.

At block 504, first signals are received at selection circuits from respective continuous portions of broken via pillars. The first signals can be received from an overlying or underlying chip in the chip stack. For example, a first signal can be received from the base chip 102 (e.g., an underlying chip) at the front side bond pad 154-1 and transmitted through the second continuous portion 302-2 of the broken via pillar 302 to be received at the selection circuit 312. Another first signal can be received from the fabric chip 104 (e.g., an overlying chip) at the backside bond pad 174-2 and transmitted through the first continuous portion 304-1 of the broken via pillar 304 to be received at the selection circuit 314.

At block 506, the first signals received at block 504 are further received at respective other circuits (e.g., PL ICs). Continuing with the above example, the first signal can be received from the second continuous portion 302-2 of the broken via pillar 302 at the PL IC 224, and the other first signal can be received from the first continuous portion 304-1 of the broken via pillar 304 at the PL IC 224.

At block 508, second signals are received at the selection circuits from respective other circuits (e.g., PL ICs). For example, a second signal can be received from the PL IC 224 at the selection circuit 312, and another second signal can be received from the PL IC 224 at the selection circuit 314. These second signals can be based on the respective first signals (e.g., signals resulting from processing the respective first signals), or can be independent of the respective first signals.

At block 510, third signals are selectively output from respective selection circuits and transmitted through continuous portions of broken via pillars. Which signal is selectively output from the selection circuit can be based on the configuration of the selection circuit provided at block 502. For example, the selection circuit 312 can output the first or second signal, which is further transmitted through the first continuous portion 302-1 of the broken via pillar 302 and output at the backside bond pad 174-1 to the fabric chip 106 (e.g., an overlying chip). If the first signal is output from the selection circuit 312, the first signal can be passed through the fabric chip 104 through the broken via pillar 302 and selection circuit 312. Otherwise, the broken via pillar 302 can serve as input for the first signal and output for a different second signal. The selection circuit 314 can output the other first or second signal, which is further transmitted through the second continuous portion 304-2 of the broken via pillar 304 and output at the front side bond pad 154-2 to the base chip 102 (e.g., an underlying chip). If the other first signal is output from the selection circuit 314, the other first signal can be passed through the fabric chip 104 through the broken via pillar 304 and selection circuit 314. Otherwise, the broken via pillar 304 can serve as input for the other first signal and output for a different second signal.

While the foregoing is directed to specific examples, other and further examples may be devised without departing from the basic scope thereof, and the scope thereof is determined by the claims that follow.

What is claimed is:

1. A multi-chip device comprising:
a chip stack comprising a plurality of chips, neighboring pairs of chips in the chip stack being attached to each other, one or more of the chips each comprising a first broken via pillar and a first selection circuit, the first broken via pillar comprising:
a first continuous portion comprising a first through substrate via (TSV) and a first metal line, the first TSV being through a semiconductor substrate of the respective chip, the first metal line being disposed within a group of dielectric layers disposed on a side of the semiconductor substrate of the respective chip; and
a second continuous portion comprising a second metal line, the second metal line being disposed within the group of dielectric layers, the first continuous portion and the second continuous portion being aligned in a direction normal to the side of the semiconductor substrate, the first continuous portion not being connected to the second continuous portion, a first input node of the first selection circuit being connected to one of the first metal line or the second metal line, an output node of the first selection circuit being connected to the other of the first metal line or the second metal line.

2. The multi-chip device of claim 1, wherein each of the one or more of the chips further includes another circuit, a second input node of the first selection circuit being connected to an output node of the other circuit.

3. The multi-chip device of claim 2, wherein the first metal line or the second metal line that is connected to the first input node of the first selection circuit is also connected to an input node of the other circuit.

4. The multi-chip device of claim 2, wherein the first selection circuit is configured to selectively output, at the output node of the first selection circuit, a signal received from the first input node of the first selection circuit or the second input node of the first selection circuit.

5. The multi-chip device of claim 2, wherein the other circuit includes a programmable logic circuit.

6. The multi-chip device of claim 1, wherein the first input node of the first selection circuit is connected to the first metal line, and the output node of the first selection circuit is connected to the second metal line.

7. The multi-chip device of claim 1, wherein the first input node of the first selection circuit is connected to the second metal line, and the output node of the first selection circuit is connected to the first metal line.

8. The multi-chip device of claim 1, wherein the one or more of the chips each comprise a second broken via pillar and a second selection circuit, the second broken via pillar comprising:
a third continuous portion comprising a second TSV and a third metal line, the second TSV being through the semiconductor substrate of the respective chip, the third metal line being disposed within the group of dielectric layers; and
a fourth continuous portion comprising a fourth metal line, the fourth metal line being disposed within the group of dielectric layers, the third continuous portion and the fourth continuous portion being aligned in a direction normal to the side of the semiconductor substrate, the third continuous portion not being connected to the fourth continuous portion, an input node of the second selection circuit being connected to the third metal line, an output node of the second selection circuit being connected to the fourth metal line, the first input node of the first selection circuit being connected to the second metal line, the output node of the first selection circuit being connected to the first metal line.

9. The multi-chip device of claim 1, wherein the first selection circuit includes a multiplexer, the first input node of the first selection circuit being a first input node of the multiplexer, and the output node of the first selection circuit being an output node of the multiplexer.

10. A multi-chip device comprising:
a first chip comprising:
a first selection circuit;
a first broken via pillar extending through a first semiconductor substrate of the first chip and a first group of dielectric layers on a first side of the first semiconductor substrate, the first broken via pillar comprising:
a first continuous portion comprising a first through substrate via (TSV) through the first semiconductor substrate, an output node of the first selection circuit being connected to the first continuous portion; and
a second continuous portion aligned with the first continuous portion in a direction normal to the first side of the first semiconductor substrate, the second continuous portion being connected to a first input node of the first selection circuit;
a second selection circuit; and
a second broken via pillar extending through the first semiconductor substrate and the first group of dielectric layers, the second broken via pillar comprising:
a third continuous portion comprising a second TSV through the first semiconductor substrate, the third continuous portion being connected to a first input node of the second selection circuit; and
a fourth continuous portion aligned with the third continuous portion in a direction normal to the first side of the first semiconductor substrate, an output node of the second selection circuit being connected to the fourth continuous portion; and
a second chip attached to the first chip.

11. The multi-chip device of claim 10, wherein the first chip further comprises:
a first other circuit having an input node connected to the second continuous portion and having an output node connected to a second input node of the first selection circuit; and
a second other circuit having an input node connected to the third continuous portion and having an output node connected to a second input node of the second selection circuit.

12. The multi-chip device of claim 10, wherein the second chip comprises:
a third selection circuit;
a third broken via pillar extending through a second semiconductor substrate of the second chip and a second group of dielectric layers on a second side of the second semiconductor substrate, the third broken via pillar comprising:
a fifth continuous portion comprising a third TSV through the second semiconductor substrate, an output node of the third selection circuit being connected to the fifth continuous portion; and
a sixth continuous portion aligned with the fifth continuous portion in a direction normal to the second side of the second semiconductor substrate, the sixth continuous portion being connected to a first input node of the third selection circuit, the first continuous portion being connected to the sixth continuous portion;
a fourth selection circuit; and
a fourth broken via pillar extending through the second semiconductor substrate and the second group of dielectric layers, the fourth broken via pillar comprising:
a seventh continuous portion comprising a fourth TSV through the second semiconductor substrate, the seventh continuous portion being connected to a first input node of the fourth selection circuit; and
an eighth continuous portion aligned with the seventh continuous portion in a direction normal to the second side of the second semiconductor substrate, an output node of the fourth selection circuit being connected to the eighth continuous portion; the third continuous portion being connected to the eighth continuous portion.

* * * * *